United States Patent [19]
Liu et al.

[11] Patent Number: 5,825,185
[45] Date of Patent: Oct. 20, 1998

[54] METHOD FOR MAGNETIC RESONANCE SPIN ECHO SCAN CALIBRATION AND RECONSTRUCTION

[75] Inventors: Haiying Liu, Minneapolis, Minn.; Francis H. Bearden, Twinsburg; Gordon D. DeMeester, Wickliffe, both of Ohio

[73] Assignee: Picker International, Inc., Highland Heights, Ohio

[21] Appl. No.: 757,153

[22] Filed: Nov. 27, 1996

[51] Int. Cl.$^6$ .................................................. G01V 3/00
[52] U.S. Cl. ............................................ 324/309; 324/307
[58] Field of Search .................................... 324/309, 307, 324/306, 314, 300, 312

[56] References Cited

U.S. PATENT DOCUMENTS

| 4,851,779 | 7/1989 | DeMeester et al. | 324/309 |
| 5,138,259 | 8/1992 | Schmitt et al. | 324/309 |
| 5,581,184 | 12/1996 | Heid | 324/309 |
| 5,621,321 | 4/1997 | Liu et al. | 324/307 |
| 5,742,163 | 4/1998 | Liu et al. | 324/309 |

FOREIGN PATENT DOCUMENTS

| 0296834A2 | 12/1988 | European Pat. Off. . |
| 0296834A3 | 12/1988 | European Pat. Off. . |
| 0490528A1 | 6/1992 | European Pat. Off. . |
| 0772057A1 | 7/1997 | European Pat. Off. . |
| 4005675A1 | 8/1991 | Germany . |
| 4445782C1 | 7/1996 | Germany . |

OTHER PUBLICATIONS

Hennig, J., et al. "RARE Imaging: A Fast Imaging Method for Clinical MR," Mag. Res. Med., 3, pp. 823–833 (1986).
Mulkern, R.V., et al., "Contrast Manipulation and Artifact Assessment of 2D and 3D Rare Sequences," Mag. Res. Imaging, 8, pp. 557–566 (1990).
Zhou, et al., "On Phase Artifacts of High–Field Fast Spin–Echo Images," SMRI Abstract Book, p. 1248 (Aug. 1993).
Zhou, et al., "Reduction of Ringing and Blurring Artifacts in Fast Spin–Echo Images," SMRI Abstract Book, p. 935 (Aug. 1993).
Zhou, et al., "Reduction of Ringing and Blurring Artifacts in Fast Spin–Echo Images," J. Mag. Res. Imaging, 3, pp. 803–807 (Sep./Oct. 1993).

(List continued on next page.)

Primary Examiner—Louis M. Arana
Attorney, Agent, or Firm—Fay, Sharpe, Beall, Fagan, Minnich & McKee

[57] ABSTRACT

A transmitter (24) and gradient amplifiers (20) transmit radio frequency excitation and other pulses to induce magnetic resonance in selected magnetic dipoles and cause the magnetic resonance to be focused into a series of echoes (66) at each of a plurality of preselected echo positions following each excitation. A receiver (38) converts each echo into a data line. Calibration data lines having a close to zero phase-encoding are collected and used to generate correction parameters (102) for each of the echo positions. These parameters include relative echo center positions (96) and unitary complex correction vectors (106). The calibration data lines for each of the preselected positions are one-dimensionally Fourier transformed (82) and multiplied (90) by the same complex conjugate reference echo (80). These data lines are then inverse Fourier transformed (92) to generate an auxiliary data array (94). A relative echo center position is computed (96) which represents a fractional shift of the true center relative to the reference echo. A complex sum is computed (104) from the relative echo center position and normalized (106) to generate a unitary correction vector. The phase-correction parameters are used to phase-correct (116) imaging data lines. The phase-corrected imaging data lines are sorted (122) to build an image plane which is one-dimensionally Fourier transformed (128) in the phase-encoding direction to produce a final corrected image (130) for display on a monitor (134).

18 Claims, 7 Drawing Sheets

OTHER PUBLICATIONS

Wan, et al., "Reduction of Phase Error Ghosting Artifacts in Thin Slice Fast Spin–Echo Imaging," Mag. Res. Med., 34, pp. 632–638 (1995).

Press, et al. "Numerical Recipes in Fortran: The Art of Scientific Computing," 2nd. ed. (1992).

XP002057350 2D Phase Correction For Multiple Shot EPI, Haiying Liu, et al. Proceedings International Society Magnetic Resonance Medicine, vol. 3.

XP002057349 Cross–Correlation in MRI: Image Reg., P.V. Connaughton, et al. Book of Abstracts vol. 2, Society Magnetic Resonance Medicine and Biology.

METHOD FOR MAGNETIC RESONANCE SPIN ECHO SCAN CALIBRATION AND RECONSTRUCTION

BACKGROUND OF THE INVENTION

The present invention relates to the magnetic resonance arts. It finds particular application in conjunction with fast-spin echo imaging (FSE) and will be described with particular reference thereto. However, it is to be appreciated that the present technique is also applicable to other FSE imaging sequences such as single shot FSE and 3-dimensional FSE. Further, the present technique is applicable to other imaging sequences with repeated spin echoes, gradient echoes, or combinations of spin and gradient echoes such as echo planar imaging (EPI), echo volume imaging (EVI) techniques, and gradient and spin echo (GSE) techniques.

Heretofore, magnetic resonance imaging subjects have been positioned in a temporally constant magnetic field such that selected magnetic dipoles preferentially align with the magnetic field. A radio frequency pulse is applied to cause the preferentially aligned dipoles to resonate and emit magnetic resonance signals of a characteristic resonance radio frequency. The radio frequency magnetic resonance signals from the resonating dipoles are read out for reconstruction into an image representation.

To strengthen the received magnetic resonance signals, the initial signal is commonly refocused into an echo. Following the radio frequency excitation pulse with a 180° pulse refocuses the signal as a spin echo. Analogously, reversing the polarity of a magnetic field gradient induces a field or gradient echo. Moreover, by repeating the 180° radio frequency refocusing pulse, a series of spin echoes can be generated after each radio frequency excitation pulse. Analogously, by repeating the reversing of the magnetic field gradient, a series of gradient echoes can be generated following the radio frequency excitation pulse. As yet another option, a single radio frequency excitation pulse can be followed by a mixture of spin and gradient echoes. See, for example U.S. Pat. No. 4,833,408 of Holland, et al.

In a two-dimensional Fourier transform imaging technique, a read gradient is applied during the read out of the echo for frequency encoding along a read axis and a phase-encode gradient is pulsed to step phase-encoding along a phase-encode axis between echoes. The relative phase-encoding of the data lines controls their relative position in k-space. In this manner, each echo generates a data line in k-space. Conventionally, the data line with zero phase-encoding extends across the center of k-space. In conjunction with the phase-encode gradient pulses, 180° refocussing pulse oscillate the data lines equal distance above and below the center line of k-space. Thus, a first 180° refocussing pulse generates a first data line encoded with a positive phase-encoding gradient pulse above the center line of k-space. The distance above the center line of k-space is proportional to the accumulated phase encoding. A second 180° refocussing pulse generates a second data line below the center line of k-space. The first and the second data lines are equidistant from the center line of k-space. By applying phase-encode gradient pulses and 180° refocussing pulses, a matrix, such as a 256×256 or a 512×512, etc., matrix of data values in k-space is generated. Fourier transformation of these values generates a conventional magnetic resonance image.

In a fast spin echo (FSE) imaging sequence, a single radio frequency excitation pulse of arbitrary tip angle is followed by a pre-determined number of 180° refocusing pulses to generate spin echoes. The spin echoes form at each of a plurality of echo positions in a repeat time TR. Data lines are read from the echoes with a read gradient that encodes the image object in the direction of the field gradient. In addition, a series of phase-encoding gradient pulses orthogonal to the read gradient direction are applied before each echo to both positively and negatively step the data lines through k-space. Further, a series of equal yet oppositely polarized phase-encoding gradient pulses are applied after each echo to remove the phase encoding of the previous phase-encoding gradient pulse. The image of the object is preferably obtained with two one-dimensional Fourier transforms of the echo data. This FSE technique offers a fast imaging technique for subjects with long $T_2$.

More particularly, a typical FSE acquisition generates a train of independently phase encoded echoes for each MR excitation or shot of a TR. The whole echo train can be as long as 16 or more. Thus, the TR would have 16 echo positions. Without loss of any generality, a raw data line $r_q(t_m)$ in the time domain has a digital value for each of q-th echoes of a FSE imaging acquisition. The value q denotes the echo index and assumes the values $1, 2, \ldots N_{echo}$. Each data value is sampled at a time $t_m = (m/N)T$. The integer index m goes from $-N/2$ to $N/2-1$, with N being the length of the time domain data sampled. T is the data sampling interval. $N_{echo}$ is the number of echoes in the echo train. Hereafter, "row" is used to refer the read-out direction, "column" to refer the phase-encode direction.

A row of Fourier transformed data of $q^{th}$ echo is denoted using a capitalized letter $R(x)$ as, $$R_q(xn) = FT\{r_q(t)\}$$
$$X_n = n/N \text{ FOV}$$
$$n = -N/2, \ldots, N/2-1,$$

where FT denotes a discrete fourier transformation (DFT) operation of length N and FOV represents the field of view along the read-out direction.

FSE sequences and other sequences are sensitive to phase error in the signal between echoes. Current imaging techniques struggle to reduce these phase errors. One such technique used in sequence tuning involves adjusting the phase of the excitation RF pulse as a prescan acquisition to maintain the required phase relationship with respect to the refocusing pulse. To reduce the phase errors of imaging or blurring, other techniques use an extra train of echoes to estimate and more accurately account for T2 relaxation, and to estimate and correct the phase errors.

Figure 1:
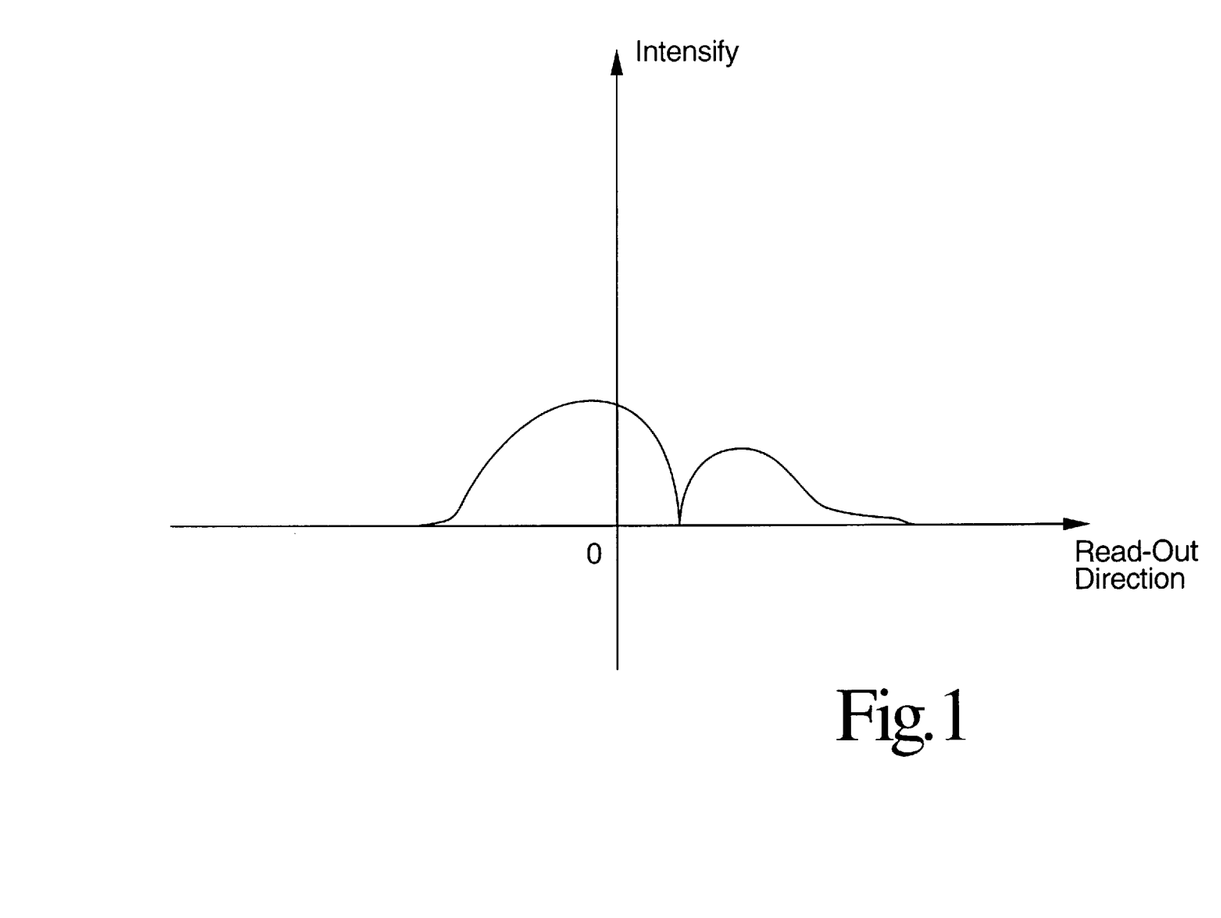
FIG. 1 is a graph of the intensity of a projection profile in the read out direction when using a surface or a multiple loop array as the RF receive coil.

These correction techniques share the step of using a phase correction vector generated from calibration data for every echo. This is effective in FSE techniques when a volumetric RF receive coil is used. However, there are still problems with these techniques which cause failure under certain circumstances. Under some normal imaging conditions, the current correction techniques lead to a numerical instability in their algorithms. For example, when using a surface or a multiple loop array as the RF receive coil to achieve a better signal to noise ratio, the spatial non-uniform reception phase of the coil can generate a "zero", i.e., zero intensity, in the projection profile of the calibration data as illustrated in FIG. 1. A zero amplitude in the calibration projection profile is then translated into an ill-defined phase value for later phase correction. In the final image, this ill-defined phase results in a line artifact along the phase-encoding direction at the same location.

Similarly, routine clinical imaging techniques involving high levels of noise and various other non-ideal factors can also generate phase errors due to non-uniform distribution of the RF phase.

The present invention is directed to a new and improved data acquisition technique which overcomes the above-referenced problems and others.

SUMMARY OF THE INVENTION

In accordance with the present invention, there is provided an apparatus and method for magnetic resonance imaging. A magnetic resonance imaging system includes a magnet for generating a temporally constant magnetic field through an examination region. The system also includes a radio frequency pulse controller and transmitter for exciting and inverting magnetic dipoles in the examination region. Excitation of the magnetic dipoles begins a repeat time TR of a sequence. Gradient magnetic field coils and a gradient magnetic field controller generate at least phase and read magnetic field gradient pulses in orthogonal directions across the examination region. Radio frequency magnetic resonance echoes are generated. A receiver receives and demodulates the radio frequency magnetic resonance echoes to produce a series of data lines. An image memory stores a reconstructed image representation. The improvement comprises a phase-correction parameter generator which generates a plurality of phase-correction parameters including relative echo center positions and complex vectors. At least some of the parameters correspond to a plurality of echo positions in the TRs of the sequence. The phase-correction parameter generator receives calibration data lines from the echo positions and independently generates at least one corresponding phase-correction parameter for each echo position. The phase-correction parameter generator includes an echo center position processor for calculating the relative echo center position for each of the echo positions. The phase-correction parameter generator also includes a complex sum processor for receiving the data of the relative echo center positions and computing a complex sum therefrom in spatial domain for each of the echo positions.

In accordance with a more limited aspect of the invention, the phase-correction parameter generator includes a multiplication circuit. The circuit multiplies a reference echo data line, pixel by pixel, by a calibration data line corresponding to each one of the echo positions.

In accordance with a more limited aspect of the invention, the phase-correction parameter generator includes a one-dimensional inverse Fourier transform processor for receiving data lines from the multiplication circuit. The processor processes the data lines corresponding to each echo position to generate an auxiliary data array in time domain for all echo positions.

In accordance with a more limited aspect of the invention, the phase-correction parameter generator includes a normalizing circuit for normalizing the complex sums from the complex sum processor to generate unitary complex vectors for each of the echo positions.

In accordance with another limited aspect of the present invention, a phase-correction processor phase-corrects image data lines. The phase-correction processor receives image data lines and phase-correction parameters from the phase-correction parameter generator and generates therefrom phase-corrected image data lines.

One advantage of the present invention is that it provides improved phase-correction.

Another advantage of the present invention is that it eliminates line artifacts in the phase-encode direction.

Another advantage of the present invention is that additional hardware and hardware modifications are not required.

Another advantage of the present invention is that it improves image quality, particularly in terms of improving spatial resolution and reducing Gibbs ringing and distortion.

Another advantage of the present invention is that the technique does not add a significant increase in scan time.

Another advantage of the present invention is that the technique offers a more robust and reliable phase correction in the presence of high levels of noise and non-uniform distributions of RF reception phase.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION OF THE PREFERRED EMBODIMENTS

Figure 2A:
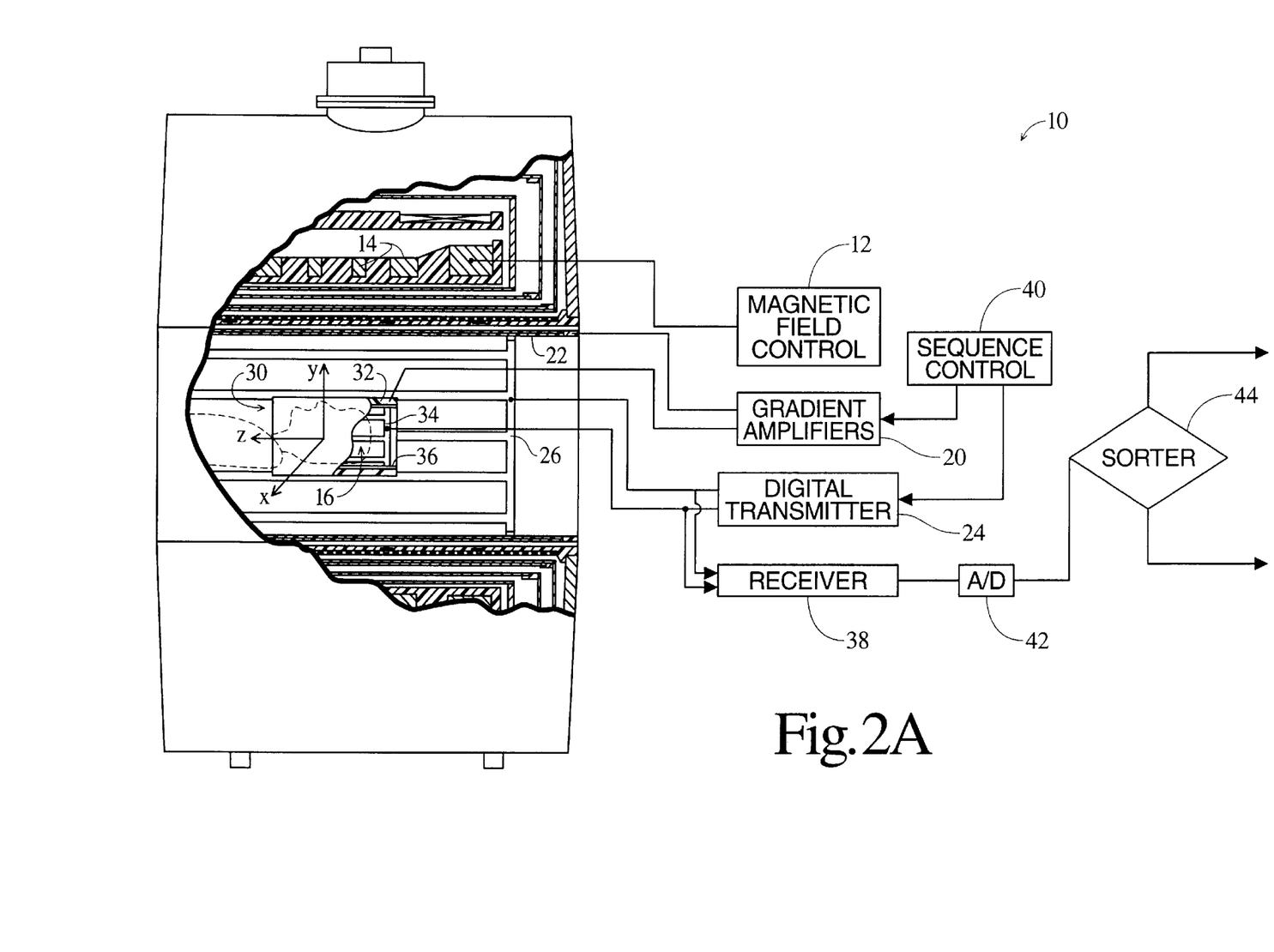
FIGS. 2A and 2B taken together are a diagrammatic illustration of a magnetic resonance imaging system in accordance with the present invention.
Figure 2B:
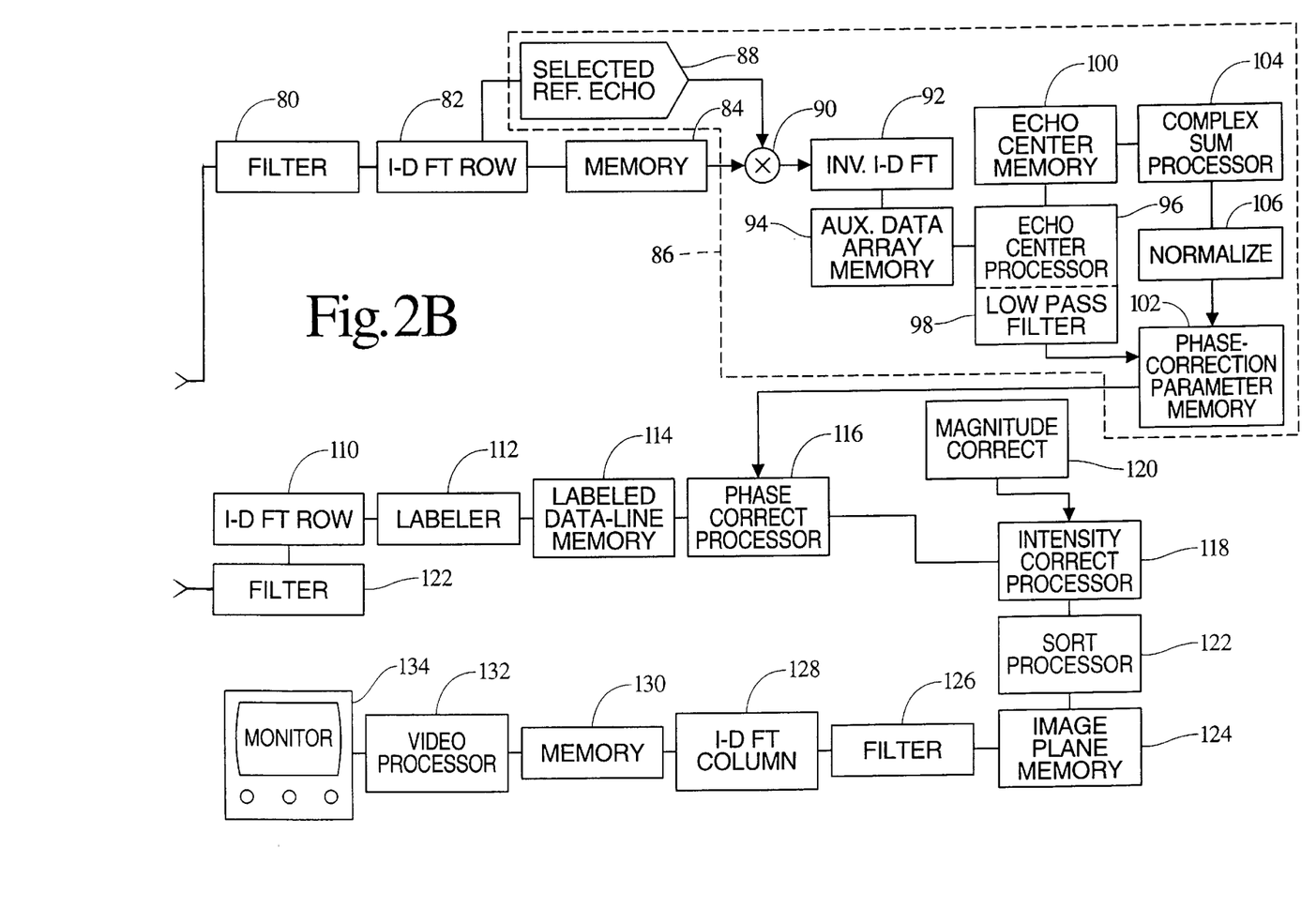

With reference to FIGS. 2A and 2B, a magnetic resonance imaging system 10 includes a main magnetic field control 12 which controls superconducting or resistive magnets 14 such that a substantially uniform, temporally constant magnetic field is created along a z-axis through an examination region 16. A magnetic resonance echo means applies a series of radio frequency (RF) and magnetic field gradient pulses to invert or excite magnetic spins, induce magnetic resonance, refocus magnetic resonance, manipulate magnetic resonance, spatially and otherwise encode the magnetic resonance, saturate spins, and the like in order to generate magnetic resonance imaging and spectroscopy sequences.

More specifically, gradient pulse amplifiers 20 apply current pulses to selected ones or pairs of whole body gradient coils 22 to create magnetic field gradients along x, y, and z-axes of the examination region. A digital radio frequency transmitter 24 transmits radio frequency pulses or pulse packets to a whole body RF coil 26 to transmit RF pulses into the examination region. A typical radio frequency pulse is composed of a packet of immediately contiguous pulse segments of short duration which taken together with each other and any applied gradients achieve a selected magnetic resonance manipulation. The RF pulses are used to saturate spins, excite resonance, invert magnetization, refocus resonance, or manipulate resonance in selected portions of the examination region. The resonance signals are picked up by the whole-body RF coil 26.

To generate images of limited regions of the subject, local coils are placed contiguous to the selected region. For example, an insertable head coil 30 is inserted surrounding a selected brain region at the isocenter of the bore. The insertable head coil 30 includes local gradient coils 32 which receive current pulses from the gradient amplifiers 20 to create magnetic field gradients along x, y, and z-axes in the examination region within the head coil 30. A local radio frequency coil 34 is used to excite magnetic resonance and receive magnetic resonance signals emanating from the patient's head. The local coil is a surface or multiple-loop array. Alternatively, a receive-only local radio frequency coil can be used to receive resonance signals induced by body-coil RF transmissions. An RF screen 36 blocks the RF signals from the RF head coil from inducing eddy currents in the gradient coils and the surrounding structures. The resultant radio frequency signals are picked-up by the whole-body RF coil 26, the local RF coil 34, or other specialized RF coils and demodulated by a receiver 38.

A sequence control circuit 40 controls the gradient pulse amplifiers 20 and the transmitter 24 to generate any of a plurality of multiple echo sequences, including echo-planar imaging, echo-volume imaging, gradient and spin echo imaging, fast spin echo imaging, and the like. For the selected sequence, the receiver 38 receives a plurality of data lines in rapid succession following each RF excitation pulse. Preferably, the receiver 38 is a digital receiver or, as shown here, is accompanied by an analog-to-digital converter 42 for converting each data line into a digital format.

Figure 3:
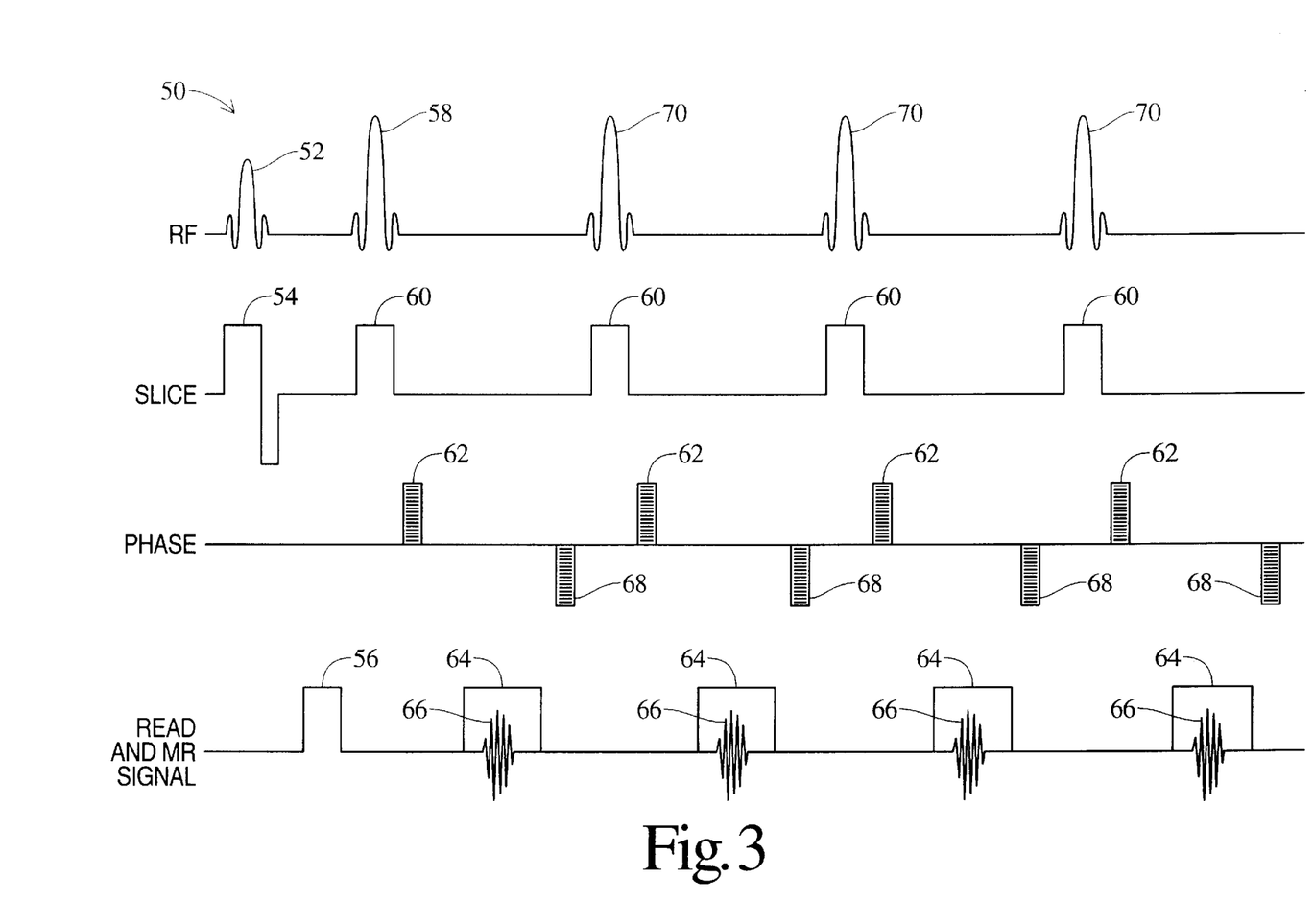
FIG. 3 illustrates one repeat of a preferred fast spin echo imaging sequence.
Figure 4:
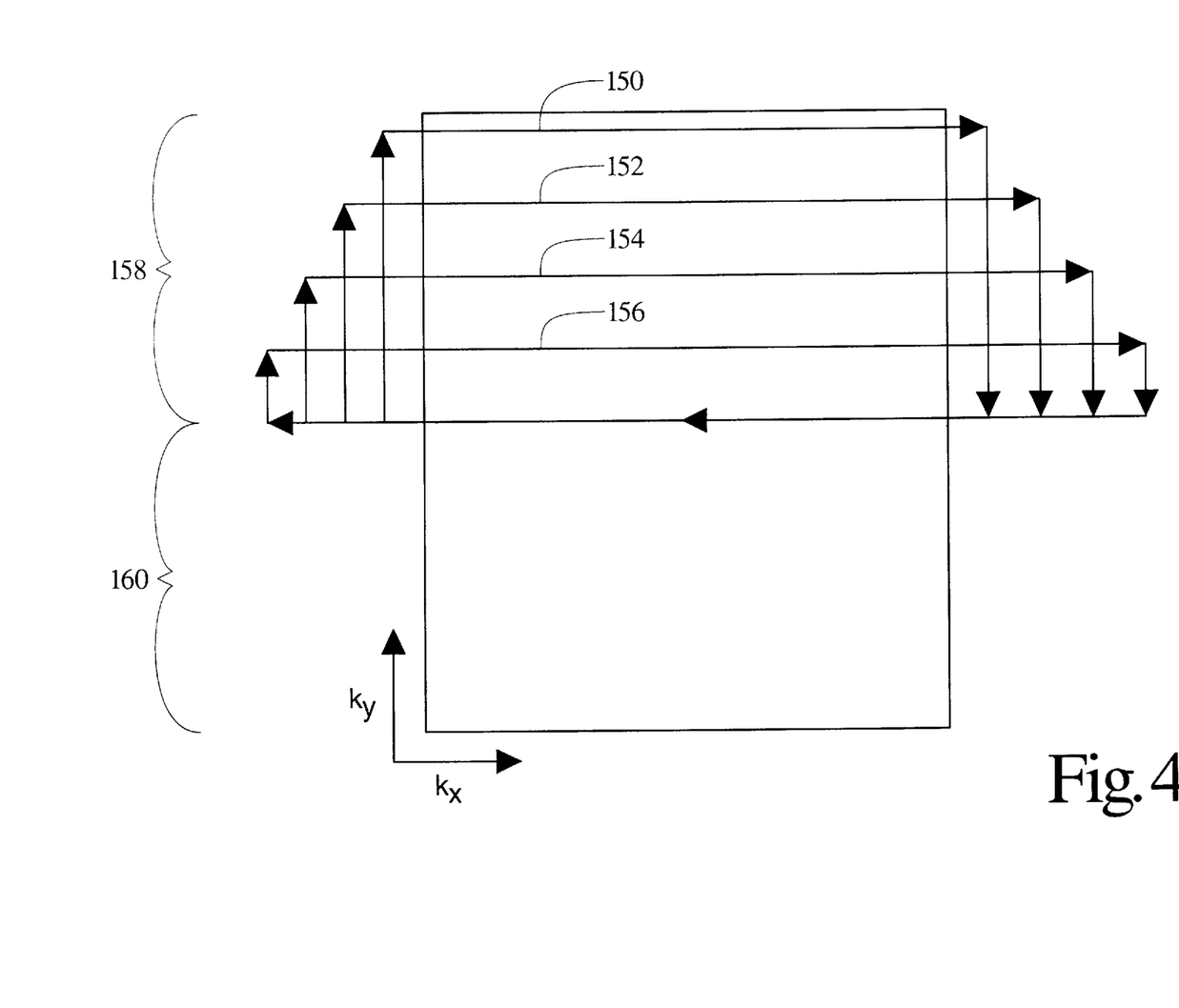
FIG. 4 illustrates an exemplary filling of k-space.

With reference to FIG. 3, an imaging FSE sequence 50 commences with a radio frequency excitation pulse 52. The pulse is applied concurrently with a bipolar slice select gradient pulse 54 to tip the magnetization by a selected tip angle, e.g., within a selected slice. Thereafter, a read gradient preparation pulse 56 is applied. A 180° inversion pulse 58 is applied with a slice-select gradient pulse 60. A positive phase-encode gradient pulse 62 steps to an initial one of n segments of k-space. A read gradient pulse 64 is applied. The inversion pulse rephases the magnetization into a spin echo 66 during the read gradient pulse 64. The spin echo is phase-encoded with the phase set by the phase-encode gradient pulse 62. Thereafter, a negative phase-encode gradient pulse 68 is applied to remove the phase-encoding and return to the origin of k-space. A second inversion pulse 70 is applied to generate a second spin echo. A total of four inversion pulses 70 are applied in the illustrated embodiment to generate four spin echoes 66 corresponding to the four traversals of k-space illustrated in FIG. 4. Positive phase encode gradient pulses 62 are applied before each spin echo to step the data lines from the subsequent spin echoes among the n regions of k-space. Negative phase encode gradient pulses 68 cancel the phase encoding before each refocusing. In the more general case, n inversion pulses are applied to generate n spin echoes. FIGS. 3 and 4 illustrate the embodiment in which n=4.

A calibration FSE sequence corresponding to the imaging FSE sequence is the same as the imaging sequence except that the phase-encoding pulses 62, 68 are set to zero such that each echo traverses the origin of k-space.

As in the imaging FSE sequence, all other parameter settings for the calibration sequence are the same as for the imaging sequence. In each calibration repetition, the initial phase-encoding gradient pulse is stepped to each of a small number of phase-encode values near the zero phase-encode origin. The calibration sequence is repeated, each time with a different phase-encoding gradient pulse.

In the preferred embodiment, the calibration data line acquisition is performed first, then followed by the imaging acquisition. However, other orders are contemplated. The imaging acquisition may be performed first, then followed by the calibration acquisition. Further, the calibration acquisition may even be performed in the middle of the imaging acquisition. The calibration and imaging acquisition are performed near in time to each other to minimize the probability of patient movement between the acquisitions.

Referring again to FIGS. 2A and 2B, the digital data lines are sorted by sorter 44 between calibration data lines and image data lines. The calibration data lines are passed through a low pass or smoothing filter 80, preferably a Blackman, Hanning, Hamming, or Gaussian filter. The filter centers around the projected center of the echo. The calibration data lines are smoothed with the filter to reduce the noise level in later data processing.

A one-dimensional Fourier transform processor 82 performs a one-dimensional Fourier transform $FT\{r_q(t)\}$ in the row direction on the echoes $r_q(t)$:

$$R_q(x_n) = FT\{r_q(t)\} \tag{1a}$$

$$X_n = n/N \text{ FOV} \tag{1b}$$

$$n = -N/2, \ldots, N/2-1 \tag{1c}$$

The transformed calibration data lines $R_q(x_n)$ are loaded into a calibration data line memory 84.

For a 2-dimensional single slice FSE acquisition, a phase-correction parameter generator 86 generates a set of parameters for both zero and first order phase correction. The parameters are determined from the calibration data for each echo position of an echo train or repeat time TR.

More particularly, a first echo from an echo train is selected as a reference echo, its complex conjugate taken and stored in a reference echo memory 88. Any echo may be selected; however, an early echo generally has a better signal to noise ratio.

An auxiliary data array $s_q(t_m)$ is constructed in time domain for each echo position of the echo train. First, a multiplication circuit 90 multiplies each Fourier transformed data line $R_q(x_n)$ corresponding to each echo position, pixel by pixel, with the complex conjugate of the reference echo $R^*_{ref}(x_n)$. Then an inverse Fourier transform processor 92 performs an inverse Fourier transformation, i.e.:

$$s_q(t_m) = FT^{-1}\left\{ \sum_{x_n} R_q(x_n) R_{ref}^*(x_n) \right\}, \tag{2}$$

where $FT^{-1}$ denotes an inverse Fourier transformation. This enhances the echo signal to create a sharp symmetric peak. The auxiliary data array $s_q(t_m)$ is stored in auxiliary data array memory 94.

Next, an echo center processor 96 computes the center of the auxiliary data array $s_q(t_m)$ along the time axis in the sense of the 1st order moment (gravity) as, $$\delta_q = \frac{\sum_m |s_q(t_m)| t_m}{\sum_m |s_q(t_m)|}. \tag{3}$$

The $\delta_q$ represents a fractional shift of the true center of echo q relative to the reference echo. This provides a good estimate of the position of the center of gravity of the echo, i.e., relative center of the echo, with respect to the reference echo. In calculating the relative center of the echo, a low pass filter 98, which emphasizes the data points around the echo center, is applied to the time domain data to suppress noise contribution. For a well tuned FSE acquisition sequence, this shift should be very small, i.e., a few sample points. The filtered and computed data representing the center of the auxiliary data array $s_q(t_m)$ is stored in echo center memory 100. In addition, the data representing the center of the auxiliary data array $s_q(t_m)$ is stored in phase-correction parameter memory 102.

A complex sum processor 104 computes a complex sum in spatial domain for all echo projections as:

$$\Phi_q = \sum_{x_n} R_q(x_n) R_{ref}^*(x_n) e^{i\alpha_q x_n}. \tag{4}$$

The parameter $\alpha_q$ represents a spatial first order phase error for echo q with respect to reference echo along the read direction. Its numerical value is given by $$\alpha_q = \frac{2\pi\delta}{FOV}. \tag{5}$$

Using the optimal peak shift estimate $\delta$, the previously defined complex sum can be written as:

$$\Phi_q = \sum_{x_n} R_q(x_n) R_{ref}^*(x_n) e^{i2\pi\delta \frac{(n-N/2)}{N}}. \tag{6}$$

A unitary complex vector processor 106 normalizes the resulting complex value of the previous summation to obtain a unitary complex vector:

$$c_q = \frac{\Phi_q^*(\delta)}{|\Phi_q(\delta)|}, \tag{7}$$

where * denotes the complex conjugate. This is performed for each of the echo positions. The unitary complex vectors for each of the echo positions are stored in the phase-correction parameter memory 102. Thus, the phase-correction parameter memory contains the unitary complex vectors as well as data representing the center of the auxiliary data array $s_q(t_m)$ for all echo positions. This set of phase correction parameters $\hat{c}_q$ and $\delta_q$ is generated for all echo positions $q=1, \ldots, N_{echo}$ of a TR or echo train. These phase-correction parameters are saved for use in phase correcting the imaging data.

The phase correction parameters can be saved in different forms. In the preferred embodiment, the phase correction parameters are stored as a set of unitary complex vector arrays $\hat{u}_q$ in projection space, i.e.:

$$\hat{u}_q(x_n) = \hat{c}_q e^{i\alpha_q x_n} \tag{8}$$

Each vector in the array corresponds to a corresponding echo in the echo train. Of course, the phase correction data can be saved in other forms.

In a multi-slice acquisition, calibration data is obtained for all slice positions so that every slice and echo will have its own phase correction parameters. The phase correction parameters are thus dependent on both echo number and slice position.

With continuing reference to FIGS. 2A and 2B, to perform the image processing, each data line from the sorter 44 is passed through a low pass or smoothing filter 108, preferably a Blackman, Hanning, Hamming, or Gaussian filter.

Using the notation for time domain data as before, all of the imaging data rows $r_q(t_m, s)$ for each of echoes $q=1, \ldots, N_{echo}$ of each of the shots are generated. A shot is a single repeat time TR or partial experiment which starts with an excitation pulse and follows with a train of echoes. The value $t_m$ equals $(m/N)T$. The index q denotes the echo index. The integer index m goes from $-N/2$ to $N/2-1$. The value N is the length of the time domain data sampled. T is the data sampling time and s is the shot index. $N_{echo}$ is the number of echoes in the echo train.

A one-dimensional Fourier transform processor 110 performs a one-dimensional Fourier transform FT on the data $r_q(t, s)$ from the filter in the row direction:

$$R_q(x_n, s) = FT\{r_q(t, s)\} \tag{9a}$$

$$X_n = n/N \text{ FOV} \tag{9b}$$

$$n = -N/2, \ldots, N/2-1 \tag{9c}$$

A labeler 112 labels each data line according to its echo and slice indexes. The labelled data lines are stored in memory 114.

A phase correction processor 116 phase corrects each data line of each of the echoes $q=1, \ldots, N_{echo}$ with the corresponding correction in the spatial domain vector from the phase correction parameter memory 102, i.e.,:

$$R_q^c(x_n, s) = R_q(x_n, s) c_q e^{j2\pi\delta q n/N} \tag{10a}$$

$$n = -N/2, \ldots, N/2-1 \tag{10b},$$

where superscript "$c$" stands for the corrected data line, R denotes phased encoded imaging data, and q is the echo number index. In this embodiment, corrections depend only on the echo number index, not on the shot number index.

After each data line is phase corrected, an intensity correction processor 118 normalizes or standardizes the echo-to-echo intensity. After each inversion, the intensity of each echo is smaller than the preceding echo. To compensate for this, a magnitude correction circuit 120 determines an appropriate amplitude correction for each echo in the series and the intensity correction processor adjusts the amplitude of each data line correspondingly. In this embodiment, the amplitude is adjusted to equal one.

Because the data lines are not collected in order, a sorting processor 122 sorts the data lines by their view index according to a pre-designed mapping function between view and echo/shot indexes to build an image plane view (q, s). The image plane is stored in image plane memory 124. A filter 126 retrieves and filters columns of data from the image plane memory in a direction orthogonal to the direction of the one-dimensional Fourier transform (i.e., in the phase-encode or column direction) performed by the first one-dimensional Fourier transform processor 110. A second one-dimensional Fourier transform processor 128 then transforms the data in one dimension along the column or phase-encode direction. The final corrected image is stored in image memory 130. A video processor 132 converts the corrected image into appropriate format for display on a video monitor 134 or other human-readable output display device.

The image data lines may be gathered by different trajectories through k-space. Referring to FIGS. 3 and 4, for example, the phase-encode gradient 62 is indexed to set the first phase encode step at data line 150 at the top of k-space, i.e., in this embodiment, at the first of 256 lines of k-space. The phase-encode gradient sets subsequent phase encode steps at data lines 152, 154, and 156, each lower in k-space, corresponding to the 33rd, the 65th and the 97th lines of k-space, respectively. On subsequent repetitions, the phase-encode gradient sets the phase-encode step at interleaved progressively lower sets of data lines within k-space to completely fill the upper half of k-space 158. To fill the lower half of k-space 160, phase-encode gradient pulses 62 and 68 are reversed for subsequent repeat times. Alternatively, data lines for the lower half of k-space may be generated by taking a complex conjugate relationship to the data in the upper half of k-space.

In an alternative embodiment, overlapping segments in k-space are collected and used for the image reconstruction. All the overlapping data is be combined or merged for image formation. The resulting non-uniform sampling density in k-space is then compensated.

In a multi-slice acquisition, the above described single-slice technique is applied for multiple slices with multi-slice calibration data to obtain corrected image data for all slice positions.

In another embodiment of the invention, during calibration, the center of the echo can be estimated as:

$$\delta_q = \frac{\sum_m |s_q(t_m)|^2 t_m}{\sum_m |s_q(t_m)|^2} . \tag{11}$$

This differs from Equation (3) of the preferred embodiment in that the numerator and denominator are squared which further heightens and sharpens the echo. Indeed, any exponential greater than 1 can be used to achieve this effect.

In still another embodiment of the invention, an iterative approach can be used to successively approach a more accurate determination of the center of the echo as shown in the following expression:

$$\delta_{max} = -\frac{\sum_m |s_m|^2 ker^1(m,\delta)}{\sum_m |s_m|^2 ker^2(m,\delta)} . \tag{12}$$

where i denotes an iteration index which starts from 0 with an increment of 1, and two kernel functions $ker^1$, $ker^2$ are defined and computed during data acquisition as:

$$ker^1(m,\delta) = FT^{-1}\{k^1 e^{ik\delta}\} \tag{13a}$$

$$ker^2(m,\delta) = FT^{-1}\{k^2 e^{ik\delta}\} \tag{13b}$$

The iteration repeats until it approaches a reasonable convergence.

Yet another embodiment of the invention is the following variation of the correction. An auxiliary data array $s_q(t_m)$ is constructed in time domain for all echoes by doing a complex multiplication, and then by taking an inverse Fourier transformation:

$$s_q(t_m) = FT^{-1}\{R_q(x_n)R^*_{ref}(x_n)\} \tag{14}$$

where $FT^{-1}$ denotes an inverse Fourier transformation. Then, a low pass filter (LPF) is performed to $s_q(t_m)$ It is then forward Fourier transformed back to projection space:

$$c_q(x_n) = FT\{s_q(t_m) \cdot f_{LPF}(t_m)\} \tag{15},$$

where $f_{LPF}(t)$ denotes a function of LPF. The correction vector for each echo is given by the following unitary complex array:

$$\hat{u}_q(x_n) = \frac{C_q^*(x_n)}{|C_q(x_n)|} . \tag{16}$$

In still yet another embodiment, an optimization procedure is performed for each echo first by doing a complex multiplication of two complex echo data vectors with respect to a set of parameters of different orders $\{\alpha_p, p=0,1,2,\ldots\}$. A cost function $|F(\{\alpha_p\})|$ is defined as:

$$F(\{\alpha_p\}) = \sum_{x_n} R_q(x_n) R_{ref}^*(x_n) e^{i \sum_{p=1} \alpha_p x_n^p}, \tag{17}$$

where $\{\alpha_p, p=0,1,2,\ldots\}$ denote a set of parameters for errors of various orders along the read-out direction, and p is the order index. Then, the unitary complex value for the zero-th order phase error is obtained as:

$$\hat{c}_q = \frac{F(\{\alpha_p^0\})}{|F(\{\alpha_p^0\})|} , \tag{18}$$

where $\{\alpha_p^0, p=0,1,2,\ldots\}$ are a set of optimal parameters from the maximization procedure. The phase correction is applied to the imaging data as:

$$R_q^c(x_n) = R_q(x_n) \hat{c}_q e^{i \sum_{p=1} \alpha_p^0 x_n^p} . \tag{19}$$

This embodiment of the invention is very useful with imaging sequences that have high order phase errors such as gradient spin echo (GSE) and echo planar imaging (EPI) sequences. GSE and EPI sequences are especially prone to high order phase errors because they use a mixture of gradient and spin echoes.

The preceding embodiment can be further improved by introducing another set of free parameters to represent the amplitude of the read-out gradients when the different echoes are collected. This allows an additional correction for the possible image size variation from echo to echo as a result of eddy currents or non-ideal gradient amplifier.

In another embodiment of the invention, a series of multiple pseudo-echo FSE imaging techniques are designed using the phase correction techniques discussed above that incorporate a predefined echo-view mapping scheme. This echo-view mapping scheme may be very general. The calibration data may use single or multiple reference echoes. Among all the view (or echo) data for a given slice, a certain portion of views (echoes) can be shared between different images corresponding to different pseudo echo times.

In another embodiment of the invention, the present technique can be used in sequence tuning. The phase of an excitation RF pulse can be adjusted as a pre-scan acquisition to maintain the required phase relationship with respect to the refocusing pulse.

In still another embodiment of the invention, the calibration data can also be used for the purpose of motion correction.

In another embodiment of the invention, both calibration and imaging data are obtained at the rising and falling ramps of a trapezoidal-shaped oscillatory read-out gradient.

Figure 5:
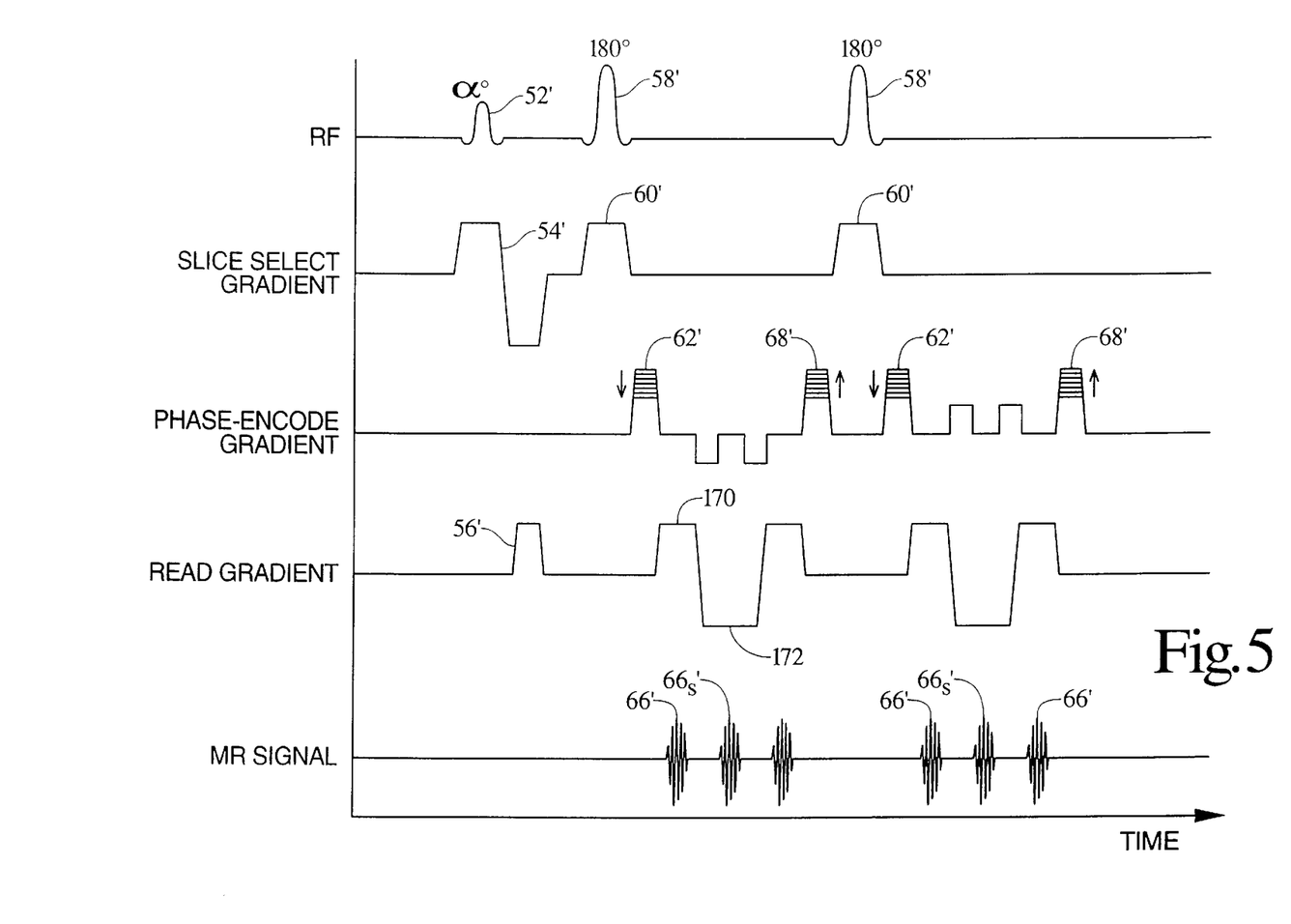
FIG. 5 illustrates a preferred gradient spin echo (GSE) imaging sequence.

With reference to FIGS. 5, other driven equilibrium sequences are also contemplated. In the illustrated gradient spin echo (GSE) sequence, like elements with the embodiment of FIG. 3 are denoted with the same reference numeral, but followed by a prime ('). For example, an $\alpha°$ excitation pulse 52' is followed by a 180° inversion pulse 58'. The timing of read gradient pulses 170, 172 are adjusted relative to the 180° refocusing pulse and the excitation pulse such that one of the generated echoes, 66$_S$' is a spin echo and the remainder are gradient echoes 66'. One or more additional 180° pulses are applied to refocus the resonance into subsequent spin echoes.

Figure 6:
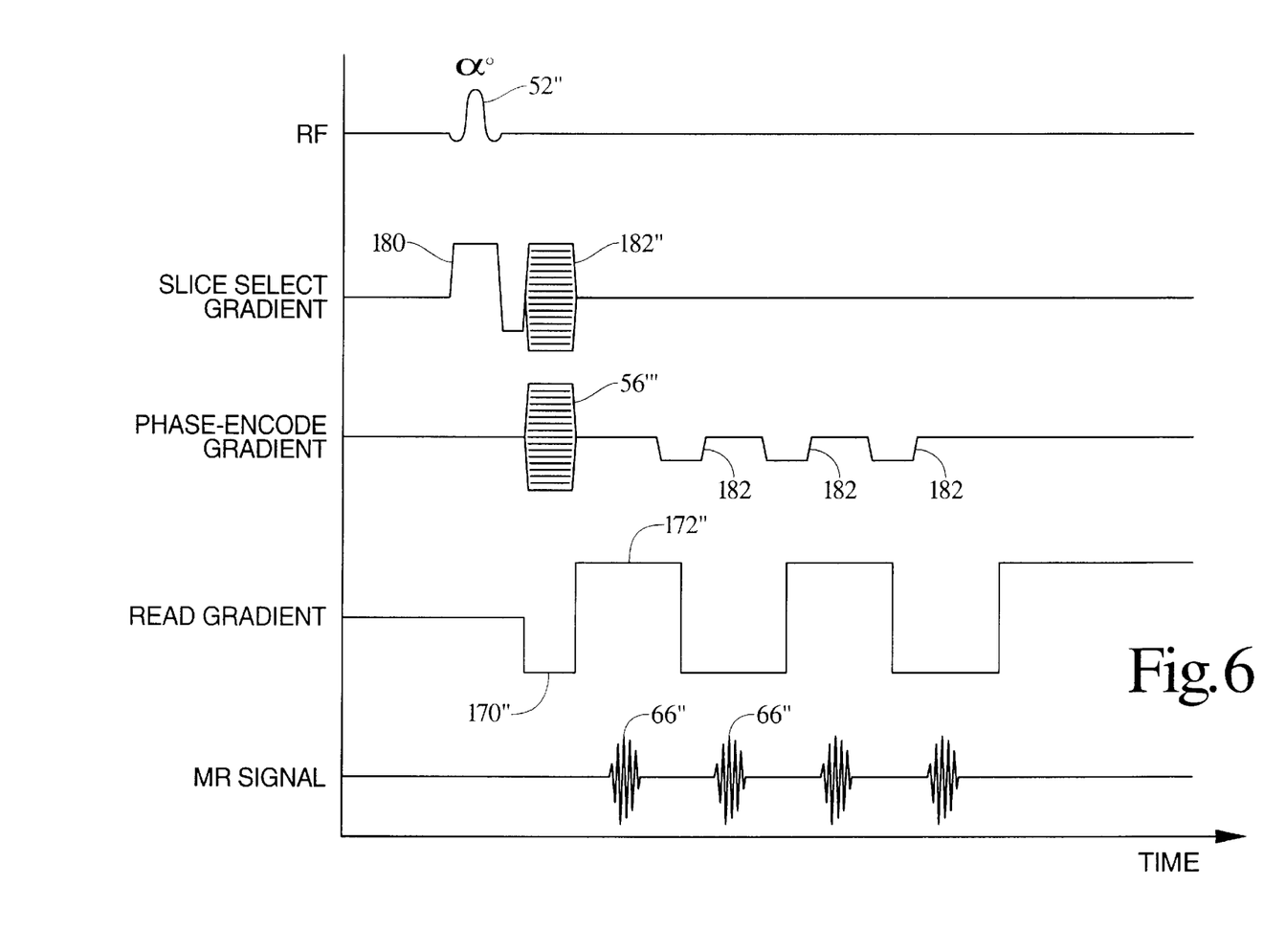
FIG. 6 illustrates a preferred echo volume imaging (EVI) sequence.

With reference to FIG. 6, in which like elements with the embodiments of FIGS. 3 and 5 are followed by a double prime ("), a slab select gradient 180 is applied on the slice-select axis concurrently with the resonance excitation pulse 52" to limit excitation to a slab. A phase-encode gradient pulse or blip 182 is then applied on the slice-select axis to step the phase along that direction. In this volume imaging technique, k-space can be envisioned as a three-dimensional rectangular prism. The blips 182 step through k-space along the secondary phase-encode axis (slice).

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. In a magnetic resonance imaging system which includes a magnet for generating a temporally constant magnetic field through an examination region, a radio frequency pulse controller and transmitter for both exciting and inverting magnetic dipoles in the examination region, the excitation of the magnetic dipoles being cyclic with a repeat time TR, and gradient magnetic field coils and a gradient magnetic field controller for generating at least phase and read magnetic field gradient pulses in orthogonal directions across the examination region such that radio frequency magnetic resonance echoes are generated, a receiver for receiving and demodulating the radio frequency magnetic resonance echoes to produce a series of data lines, and an image processor for reconstructing an image representation from the data lines comprising:

a phase-correction parameter generator which generates a plurality of phase-correction vectors the phase correction generator including:

an echo center position processor for calculating the relative echo center position for each of a plurality of echo positions in the repeat times of the sequence;

a complex sum processor for receiving the echo center positions and calibration data lines from the echo positions and independently computing a complex phase correction vector therefrom in spatial domain for each of the echo positions; and a correction processor for correcting each imaging data line with a positionally corresponding one of the correction vectors prior to reconstruction of the image representation.

2. In the magnetic resonance imaging system as set forth in claim 1, the phase-correction parameter generator including:

a multiplication circuit which multiplies a Fourier transformed reference echo data line, pixel by pixel, by a complex conjugate calibration data line corresponding to each one of the echo positions.

3. In the magnetic resonance imaging system as set forth in claim 1, the phase-correction parameter generator including:

a one-dimensional inverse Fourier transform processor for receiving data lines from the multiplication circuit and processing the data lines corresponding to each echo position to generate an auxiliary data array in time domain for all echo positions.

4. In the magnetic resonance imaging system as set forth in claim 3, the improvement further comprising:

a filter for filtering data lines.

5. In the magnetic resonance imaging system as set forth in claim 1, the phase-correction parameter generator further including:

a normalizing circuit for normalizing the complex correction vectors from the complex sum processor to generate unitary complex vectors for each of the echo positions.

6. In the magnetic resonance imaging system as set forth in claim 1, the improvement further comprising:

a magnitude correction circuit for determining an appropriate amplitude correction for each echo position; and, an intensity correction processor for normalizing the amplitude of each image data line according to the appropriate amplitude correction.

7. In the magnetic resonance imaging system as set forth in claim 1, the improvement further comprising:

a one-dimensional Fourier transform processor for transforming the phase corrected data lines, in a column direction, into the image representation.

8. In a method of magnetic resonance imaging in which magnetic resonance is excited in magnetic dipoles which are induced to form a plurality of echoes at each of a plurality of preselected echo positions following each resonance excitation, the echoes being read out along a read axis in the presence of a read gradient to form a series of data lines for reconstruction into an output image representation, the improvement comprising:

(a) receiving at least one calibration data line from each of the plurality of preselected echo positions;

(b) determining a relative peak position of the calibration data line for each echo position;

(c) computing a complex correction vector for each echo position in accordance with the calibration data line for the corresponding relative peak position and its determined complex phase at the peak;

(d) correcting each image data line using the corresponding correction vector; and (e) reconstructing the corrected data lines into an image representation.

9. In the method of claim 8, the determining of the relative peak position of the calibration data line peak including:

selecting a reference data line;

calibrating the calibration data lines to the selected reference data line;

multiplying a complex conjugate of the reference data line, pixel by pixel, with a calibration data line corresponding to each of the preselected echo positions; and one-dimensionally inverse Fourier transforming each of the data lines to generate a plurality of auxiliary data arrays in time domain, one for each of the preselected echo positions.

10. In the method of claim 9, the determining of the relative peak position of the calibration data line peak further including:

computing a relative echo peak shift as a gravity center of the auxiliary data array; and, computing a zeroth order phase difference.

11. In the method of claim 10, the improvement further comprising:

sorting the corrected imaging data lines to build an image plane; and one-dimensionally Fourier transforming the image plane in a direction orthogonal to the first Fourier transformer.

12. In the method of claim 8, the improvement further comprising:

normalizing the correction vectors to generate a unitary correction vector for each of the preselected echo positions.

13. In the method of claim 8, the improvement further comprising:

filtering the image data lines and the calibration data lines.

14. In the method of claim 8, wherein the data lines have progressively lower amplitudes at each subsequent echo position after excitation, the improvement further comprising:

adjusting the amplitude of the image data lines with an amplitude correction corresponding to the position of each echo.

15. A method for magnetic resonance imaging comprising:

repeatedly exciting magnetic dipoles to generate magnetic resonance signals, each step of exciting the magnetic dipoles initiating a repeat time TR;

refocusing the magnetic resonance signals to generate echoes at each of a plurality of echo positions in a plurality of repeat times TRs;

reading out the echoes along a read axis in the presence of a read gradient to form a series of data lines;

receiving a data line for each of the plurality of echo positions as calibration data lines;

generating phase-correction parameters from the calibration data lines, at least one of the parameters corresponding to each of the one of the plurality of echo positions, the plurality of phase-correction parameters including relative echo center positions and complex vectors, at least some of the parameters corresponding to the plurality of echo positions, wherein the step of generating the phase-correction parameters includes:

selecting a reference echo data line;

multiplying the reference echo data line, pixel by pixel, by a calibration data line corresponding to each one of the echo positions;

one-dimensionally inverse Fourier transforming the multiplied data lines to generate an auxiliary data array in time domain for each of the echo positions;

calculating a relative echo center position of the auxiliary data array in time;

computing a complex sum in spatial domain from the relative echo center positions for each of the echo positions; and normalizing the complex sums to generate unitary complex vectors for each of the echo positions.

16. The method of claim 15 further comprising receiving image data lines;

phase-correcting the image data lines using the relative echo center positions and the unitary complex vectors.

17. The method of claim 16 further comprising:

determining an appropriate amplitude correction for each echo position in the TR; and, normalizing the amplitude of each image data line according to the appropriate amplitude correction.

18. The method of claim 15, wherein the step of generating the phase-correction parameters further includes:

generating phase-correction parameters for a plurality of echo position of a plurality of slices.

* * * * *